United States Patent [19]

Sudo et al.

[11] Patent Number: 5,744,964
[45] Date of Patent: Apr. 28, 1998

[54] METHOD AND APPARATUS FOR ELECTRICAL TEST OF WIRING PATTERNS FORMED ON A PRINTED CIRCUIT BOARD

[75] Inventors: Morishiro Sudo; Masaru Ishijima; Kazuo Yamazaki, all of Kawasaki, Japan

[73] Assignee: Fujitsu Automation Limited, Kawasaki, Japan

[21] Appl. No.: 686,391

[22] Filed: Jul. 25, 1996

[30] Foreign Application Priority Data

Mar. 11, 1995 [JP] Japan .................. 7-312444

[51] Int. Cl.$^6$ ............................................. G01R 31/02
[52] U.S. Cl. ......................... 324/537; 324/519; 324/754
[58] Field of Search ............................. 324/519, 525, 324/537, 538, 754, 158.1, 73.1

[56] References Cited

U.S. PATENT DOCUMENTS

| | | | |
|---|---|---|---|
| 4,565,996 | 1/1986 | Burr et al. | 324/519 |
| 5,006,808 | 4/1991 | Watts | 324/537 |
| 5,138,266 | 8/1992 | Stearns | 324/537 |
| 5,187,430 | 2/1993 | Marek et al. | 324/537 |
| 5,363,048 | 11/1994 | Modlin et al. | 324/519 |
| 5,570,027 | 10/1996 | Stans et al. | 324/537 |
| 5,596,283 | 1/1997 | Mellitz et al. | 324/754 |

FOREIGN PATENT DOCUMENTS

| | | |
|---|---|---|
| 1-185933 | 7/1989 | Japan . |
| 6-77303 | 3/1994 | Japan . |
| 2 136 138 A | 9/1984 | United Kingdom . |
| WO 90/04792 | 5/1990 | WIPO . |

*Primary Examiner*—Vinh P. Nguyen
*Assistant Examiner*—Diep Do
*Attorney, Agent, or Firm*—Nikaido, Marmelstein, Murray & Oram LLP

[57] ABSTRACT

For a print-circuit board 10 of a good product, probes 31 and 32 are made to be electrically continuous with a ground plate 13 and a wiring pattern i respectively to measure a capacitance $C_{gi}$, which is then stored in a storage device 44. A capacitance $C_i$ of a print-circuit board 10, the object of testing, is measured in a similar manner and a ratio $\mu$=(average value $C_a$ of a several measured capacitance value of the object of testing/(average value $C_{ga}$ of the corresponding measured capacitance values of the good product) is calculated. If $C_i < C_{gj}(1-\Delta e0)$ or $C_i > C_{gj}(1+\Delta e0)$, the measured capacitance values $C_i$ and $C_{gj}$ are excluded from the objects of calculation of the average values. If $C_j < \mu.C_{gj}(1-\Delta e)$ or $C_j > \mu.C_{gj}(1+\Delta e)$, a wiring j is judged to be defective and the resistance measuring method is employed to judge the details of the defect. The tolerance rate $\Delta e0$ and $\Delta e$ are 0.15 and 0.02 respectively.

8 Claims, 3 Drawing Sheets

METHOD AND APPARATUS FOR ELECTRICAL TEST OF WIRING PATTERNS FORMED ON A PRINTED CIRCUIT BOARD

BACKGROUND OF THE INVENTION

1. Field of the Invention

The present invention relates to a method of and an apparatus for electrical test for thinning, disconnection, current leak, shorting and the like of wiring pattern on a print-circuit board.

2. Description of the Related Art

There are two methods of electrical test for wiring pattern on print-circuit boards. One is a resistance measuring method and the other is a capacitance measuring method. In the resistance measuring method, the presence/absence of thinning or disconnection in a wiring pattern is determined by measuring the resistance of the wiring and a decision is made as to whether or not there is a current leak or a short between wiring patterns by measuring the insulation resistance between different wirings. In the capacitance measuring method, the capacitance Ci between each wiring pattern i and a ground plate which is parallel to it, is measured and a decision is made as to whether or not there is a defect by comparing the capacitance Ci against the corresponding capacitance Cgi of a good product, which is measured in advance. Namely, a decision is made that there is a defect if $Ci<Cgi(1-\Delta e0)$ or $Ci>Cgi(1+\Delta e0)$ where $\Delta e0$ represents the tolerance rate, which is set in advance at a value of approximately 0.15.

Although, with the resistance measuring method, tests may be more detailed than what is possible with the capacitance measuring method, the number of measuring points is large, since insulation resistance between various wirings are measured. In addition, since two probes must be moved for each wiring, the testing time is longer compared to that required in the capacitance measuring method. Moreover, the distance between the probes is restricted. This problem becomes more pronounced in recent high-density multilayer circuit boards with the number of pads constituting probe contact points having increased to approximately 5000.

In contrast, in the capacitance measuring method, which measures the capacitances of individual wirings to the ground plate, the number of measuring points is small compared to that in the resistance measuring method and, since one of the probes can be fixed electrically continuous with the ground plate, the testing time can be greatly reduced.

However, in the capacitance measuring method, wiring defects may not always be detected due to dispersion in the wiring pattern width and thickness of the insulating layers between the wiring patterns and the ground plate. If, in order to detect all the wiring defects, the tolerance rate $\Delta e0$ is reduced, untrue defects will be detected excessively and a wiring that is determined to be defective must be tested again in detail, increasing the overall testing time.

SUMMARY OF THE INVENTION

Accordingly, an object of the present invention is to provide a method of and an apparatus for electrical wiring-pattern test with which the test quality can be improved and the testing time can be reduced.

Hereafter the term "essentially" means that resulting contents are essentially identical even when calculation expressions are different.

According to the 1st aspect of the present invention, there is provided a method of electrical test for wiring patterns formed on a print-circuit board, comprising the steps of: measuring, for each i=1 to n, a capacitance Cgi between a wiring pattern i on a print-circuit board of reference and a conductive plane arranged parallel thereto; measuring, for each i=1 to n, a capacitance Ci between a wiring pattern i on a print-circuit board to be tested and a conductive plane arranged parallel thereto; calculating a ratio $\mu$=(a representative value RV1 of the capacitances Ci, where i=1 to n)/(a representative value RV2, corresponding to the value RV1, of the capacitances Cgi, where i=1 to n) essentially; and judging, for $1 \leq j \leq n$, that the wiring j has a defect if essentially $Cj<\mu \cdot Cgj(1-\Delta e)$ or $Cj>\mu \cdot Cgj(1+\Delta e)$ with $\Delta e$ being a positive tolerance rate.

Due to dispersion in the thickness of insulating layers and dispersion in the wiring width, the capacitance ratio $\mu$ varies among different circuit boards, which results from dispersion of developing conditions. However, in a given print-circuit board, the capacitance ratio $\mu$ is assumed to be almost constant for all the wirings except defect.

With the 1st aspect of the present invention, since the capacitance ratio $\mu$ is used, the tolerance rate $\Delta e$ can be reduced sufficiently compared to the prior art, which does not employ the capacitance ratio $\mu$, and an advantage is achieved in that the rate of true defect detection is improved and the rate of untrue defect detection is lowered compared to the prior art. In addition, as the rate of untrue defect detection is reduced, the overall testing time, during which the testing is performed in combination with other detailed tests, can be reduced.

In the 1st mode of the 1st aspect of the present invention, when said wiring j has been judged to be defective, the method further comprises the steps of: measuring a conduction resistance of the wiring j; measuring an insulation resistance between the wiring j and another wiring; and judging a type of the defect based upon the conduction resistance and the insulation resistance.

With the 1st mode, since the capacitance measuring method, with its relatively short testing time, is first employed and then, only if it is decided that there is a defect, the resistance measuring method is employed, an advantage is achieved in that the overall testing time is reduced.

In the 2nd mode of the 1st aspect of the present invention, the capacitances Ci and Cgi are excluded from objects of calculation of the ratio $\mu$ if essentially $Ci<Cgj(1-\Delta e0)$ or $Ci>Cgj(1+\Delta e0)$ with $\Delta e0$ being a value larger than the $\Delta e$.

With the 2nd mode, since the ratio $\mu$ is made more accurate, $\Delta e$ can be further reduced, enhancing the advantage of the 1st aspect of the invention described above.

In the 3rd mode of the 1st aspect of the present invention, the capacitances used for calculating the ratio $\mu$ are relatively small values among all capacitances C1 to Cn and Cg1 to Cgn.

When there is a short in a wiring with a large capacitance connected to a wiring with a small capacitance, there is a possibility that it will not be excluded from the objects of calculation of the ratio. However, in the 3rd mode, this possibility is eliminated, making it possible to obtain the ratio $\mu$ more accurately.

According to the 2nd aspect of the present invention, there is provided an electrical test apparatus for wiring patterns formed on a print-circuit board, comprising: probes; a probe drive device for moving the probes and placing the probes in contact with a conductive pattern formed on the print-circuit board; a capacitance measuring device for measuring a capacitance between two of the probes; a storage device; and a control & judging device for controlling the probe device and the capacitance measuring device so as to measure, for each i=1 to n, a capacitance Cgi between a wiring pattern i of a print-circuit board of reference and a conductive plane arranged parallel thereto and so as to measure, for each i=1 to n, a capacitance Ci between a wiring pattern i of a print-circuit board to be tested and a conductive plane arranged parallel thereto, for calculating a ratio $\mu$=(a representative value RV1 of the capacitances Ci, where i =1 to n)/(a representative value RV2, corresponding to the value RV1, of the capacitances Cgi, where i=1 to n) essentially and for judging, for $1 \leq j \leq n$, that the wiring j has a defect if essentially $Cj < \mu \cdot Cgj(1-\Delta e)$ or $Cj > \mu \cdot Cgj(1+\Delta e)$ with $\Delta e$ being a positive tolerance rate.

In the 1st mode of the 2nd aspect of the present invention, the control & judging device, when the wiring has been judged to be defective, controls the probe device and the resistance measuring device so as to measure a conduction resistance of the wiring j and so as to measure an insulation resistance between the wiring j and another wiring, and judges a type of the defect based upon the conduction resistance and the insulation resistance.

In the 2nd mode of the 2nd aspect of the present invention, the control & judging device excludes the capacitances Ci and Cgi from objects of calculation of the ratio $\mu$ if essentially $Ci < Cgj(1-\Delta e0)$ or $Ci > Cgj(1+\Delta e0)$ with $\Delta e0$ being a value larger than the $\Delta e$.

In the 3rd mode of the 2nd aspect of the present invention, the control & judging device selects capacitances, which are used for calculating the ratio $\mu$, having relatively small values among all capacitances C1 to Cn and Cg1 to Cgn.

DESCRIPTION OF THE PREFERRED EMBODIMENT

Figure 1:
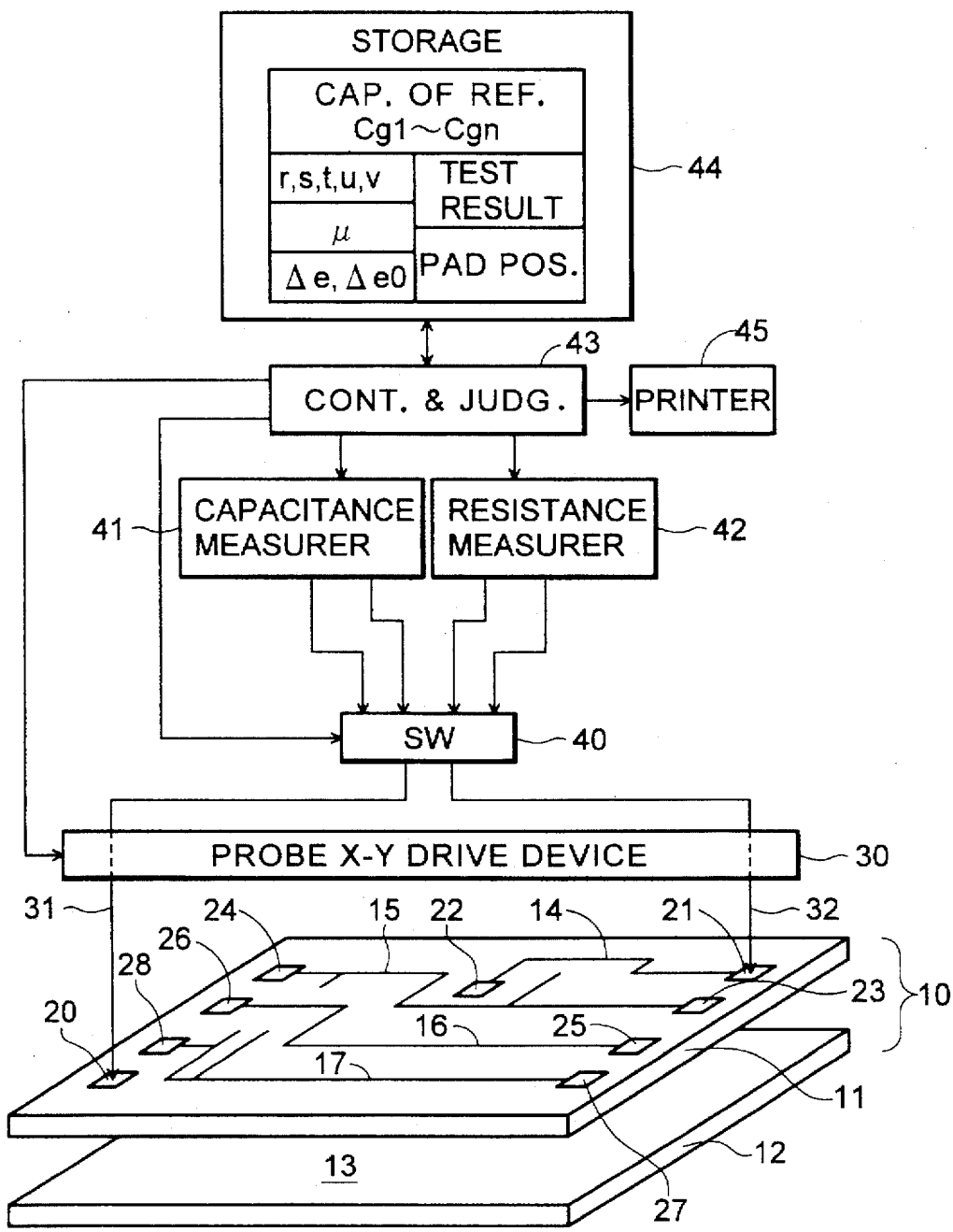
FIG. 1 is a schematic block diagram of an apparatus for electrical wiring-pattern test in an embodiment of the present invention.
Figure 2:
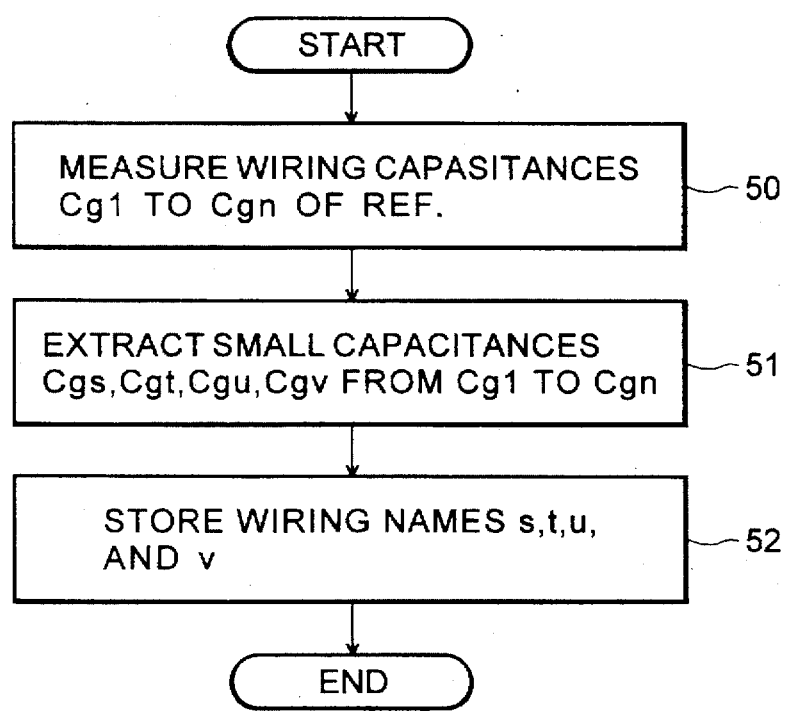
FIG. 2 is a flow chart showing the processing performed during the preparatory stage of a wiring test employing the apparatus shown in FIG. 1.
Figure 3:
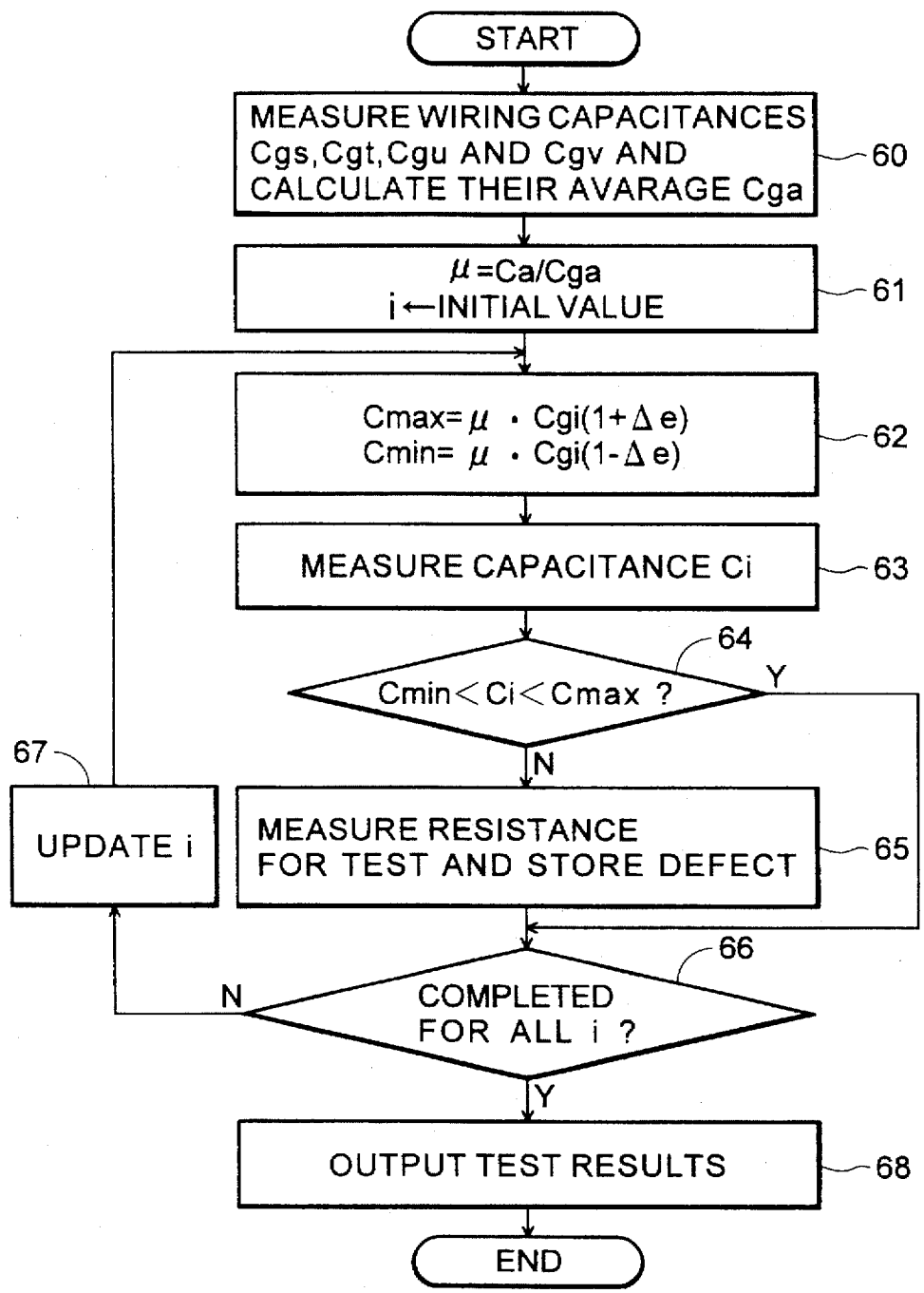
FIG. 3 is a flow chart showing the wiring test procedure employing the apparatus shown in FIG. 1.

The preferred embodiment of the present invention is understood by referring to FIGS. 1-3 of the drawings.

FIG. 1 shows the schematic structure of an apparatus for electrical wiring-pattern test. In FIG. 1, a print-circuit board 10, which is an object of testing, is separated into an insulating layer 11 and an insulating layer 12 only in order to show a grand plate 13.

In the print-circuit board 10, conductive patterns are formed on the insulating layer 11. A ground plate 13, which is constituted of metal film, is provided between the insulating layer 11 and the insulating layer 12. In FIG. 1, wiring patterns 14 to 17 and pads 20 to 28, as the conductive patterns on the insulating layer 11, are shown. The pad 20 is connected to the ground plate 13 via the insulating layer 11.

A probe X-Y drive device 30, which has a structure similar to that of an X-Y plotter, is capable of moving probes 31 and 32 within a plane running parallel to the print-circuit board 10 and, by means of compression coil springs, is also capable of pressing the tips of the probes 31 and 32 into contact with the pads by moving the probes 31 and 32 in the direction of their axes. The probes 31 and 32 are selectively connected to either a capacitance measuring circuit 41 or a resistance measuring circuit 42 by a switching circuit 40. The probe X-Y drive device 30 and the switching circuit 40 are controlled by a control & judging device 43.

The capacitance measuring circuit 41 measures the capacitance between the probe 31 and the probe 32 in response to a command for measurement issued by the control & judging device 43 and provides the measured value to the control & judging device 43. The resistance measuring circuit 42 measures the resistance between the probe 31 and the probe 32 in response to a command for measurement issued from the control & judging device 43 and provides the measured value to the control & judging device 43.

A storage device 44 and a printer 45 are connected to the control & judging device 43. The storage device 44 is constituted with, for instance, a hard disk device and RAM and is used for storing data, made based upon the wiring design data, on the positions where the probes are pressed in contact (pad positions) on the insulating layer 11, and for storing data which are to be detailed later. The printer 45 is used for outputting the results of tests.

The control & judging device 43 is constituted with, for instance, a microcomputer and executes the processing shown in FIGS. 2 and 3. FIG. 2 shows the processing performed during the preparatory stage of wiring tests and FIG. 3 shows a wiring test procedure that is executed after the processing shown in FIG. 2. The wirings to be tested on the print-circuit board 10 are referred to as wiring pattern i, where i=1 to 10. Hereafter, the numerical values within parentheses indicate step identification numbers in the drawings.

(50) For a print-circuit board 10 of a good product, the capacitance Cgi of a wiring pattern i (i=1 to 10) is measured and the measured value is stored in the storage device 44 as a reference value.

(51) Among the capacitances Cg1 to Cgn thus measured, small capacitances Cgs, Cgt, Cgu and Cgv are extracted. Cgs, Cgt, Cgu and Cgv may represent, for instance, the smallest four capacitances of the capacitances Cg1 to Cgn when they are arranged in the order of their levels, or, they may each represent the smallest value in a group of capacitances when the capacitances Cg1 to Cgn are divided into four groups.

(52) The names of the wirings s, t, u and v with the capacitances Cgs, Cgt, Cgu and Cgv respectively are stored in the storage device 44.

Next, the processing shown in FIG. 3, performed for the print-circuit board 10 which is the object of the test, is explained.

(60) The capacitances Cs, Ct, Cu and Cv of the wirings s, t, u and v (for the sake of simplification, the same reference codes are used for the wirings and their wiring names) corresponding to the capacitances Cgs, Cgt, Cgu and Cgv are measured and their average Ca as a representative value is calculated. Also, an average value Cga of the capacitances Cgs, Cgt, Cgu and Cgv as a representative value is calculated. However, if $Ck < Cgk(1-\Delta e0)$ or $Ck > Cgk(1-\Delta e0)$ with k=s, t, u and v, it is decided that there is a defect and the measured capacitance values Ck and Cgk are excluded from the objects of calculation of the average values. In this expression, the tolerance rate $\Delta e0$ may be, for instance, 0.15.

(61) The capacitance ratio $\mu$=Ca/Cga is calculated. The capacitance ratio $\mu$ varies for each print-circuit board 10 due to dispersion in the thickness of the insulating layer 11 and in the wiring width caused by uneven conditions of developing. But, in a given print-circuit board, the capacitance ratio $\mu$ is considered to be almost the same for all the wirings except defect.

The "small capacitances" are extracted in step 51, shown in FIG. 2, in order to preclude an untrue decision that there is no defect in step 60 when a wiring with a large capacitance shorts to a wiring with a small capacitance. In addition, capacitances may be divided into "four groups" in step 51 in order to average out small dispersion of the ratio μ among individual areas.

An initial value is substituted for i which identifies wiring pattern. The initial value is the smallest value excluding the above-described s, t, u and v among 1 to n.

(62) The upper limit Cmax=μ.Cgj(1+Δe) lower limit Cmin=μ.Cgj(1−Δe) in defect judging are calculated. The tolerance rate Δe may be, for instance, 0.02.

(63) The capacitance Ci of the wiring pattern i is measured.

(64) If Cmin<Ci<Cmax, the wiring pattern i is determined to be good and the operation proceeds to step 66. Otherwise, it is determined to be defective and the operation proceeds to step 65.

(65) In order to specify the type of defect in more detail, the resistance measuring method is employed for the wiring pattern i. Namely, the resistance of the wiring pattern i is measured, and a decision is made in regard to thinning or disconnection of the wiring by comparing the measured value against a preset reference value. In addition, the insulation resistance between the wiring pattern i and a wiring close to the wiring pattern i is measured and a decision is made in regard to a current leak or short between the wirings by comparing this measured value against a preset reference value. Through this testing, a decision may be made that there is no defect. If it is decided that there is a defect, the name of the wiring pattern i and the type of defect are stored in the storage device 44.

(66 to 68) If the processing described above is not completed for all the wirings i other than the wirings s, t, u, v, then i is updated and the operation returns to step 62. If the processing has been completed, the test results stored in the storage device 44 are output to the printer 45.

The tolerance rate Δe0 is set at 0.15 in the prior art method. However, in the method in this embodiment, as the capacitance ratio μ is used, making it possible to set the tolerance rate Δe at 0.02. Thus, it is possible to improve the defect detection rate and reduce the untrue-defect detection rate compared to the prior art.

Moreover, since the capacitance measuring method with a relatively short testing time is initially employed and the resistance measuring method is used only when a decision has been made that there is a defect, the testing time can be reduced.

Although preferred embodiment of the present invention has been described, it is to be understood that the invention is not limited thereto and that various changes and modifications may be made without departing from the spirit and scope of the invention.

For instance, an example in which two probes are used is explained in reference to FIG. 1. However, the present invention may take a structure in which numerous probes are used and probe selection is performed by electric scanning with the probes simultaneously pressed in contact against the pads 21, 23, 25 and 27 in FIG. 1, for instance.

Furthermore, the present invention may take a structure in which, instead of using the switching circuit 40, outputs of the capacitance measuring circuit 41 and the resistance measuring circuit 42 are connected to each other, with the output from the resistance measuring circuit 42 set to a high impedance when the measurement is performed with the capacitance measuring circuit 41 and the output from the capacitance measuring circuit 41 set to a high impedance when the measurement is performed with the resistance measuring circuit 42.

In addition, the capacitance measuring method can be adopted for a print-circuit board without the ground plate 13 by providing a ground plate constituted with a copper plate or the like on the print-circuit board.

What is claimed is:

1. A method of electrical test for wiring patterns formed on a print-circuit board, comprising the steps of:

measuring, for each i=1 to n, a capacitance Cgi between a wiring pattern i on a print-circuit board of reference and a conducive plane arranged parallel thereto;

measuring, for each i=1 to n, a capacitance Ci between a wiring pattern i on a print-circuit board to be tested and a conductive plan arranged parallel thereto;

calculating a ratio μ=an average value of some of said capacitances Ci, where 1=1 to n)/an average value of some, which correspond to said some of capacitances Ci, where i=1 to n, of capacitances Cgi, where i=1 to n,) essentially; and judging, for $1 \leq j \leq n$, that a wiring j has a defect if essentially Cj<μ.Cgj(1−Δe) or Cj>μ.Cgj(1 +Δe) with Δe being a positive tolerance rate.

2. A method according to claim 1, when said wiring j having been judged to be defective, further comprising the steps of:

measuring a conduction resistance of said wiring j;

measuring an insulation resistance between said wiring j and another wiring; and judging a type of said defect based upon said conduction resistance and said insulation resistance.

3. A method according to claim 2, wherein said capacitances Ci and Cgi are excluded from objects of calculation of said ratio μ if essentially Ci<Cgj(1−Δe0) or Ci>Cgj(1+Δe0) with Δe0 being a value larger than said Δe.

4. A method according to claim 3, wherein said capacitances used for calculating said ratio μ are relatively small values among all capacitances C1 to Cn and Cg1 to Cgn.

5. An electrical test apparatus for wiring patterns formed on a print-circuit board, comprising:

probes;

a probe drive device for moving said probes and placing said probes in contact with a conductive pattern formed on said print-circuit board;

a capacitance measuring device for measuring a capacitance between two of said probes;

a storage device; and a control & judging device for controlling said probe drive device and said capacitance measuring device so as to measure, for each i=1 to n, a capacitance Cgi between a wiring pattern i of a print-circuit board of reference and a conductive plane arranged parallel thereto and so as to measure, for each i=1 to n, a capacitance Ci between a wiring pattern i of a print-circuit board to be tested and a conductive plane arranged parallel thereto, for calculating a ratio μ=an average value of some of said capacitances Ci, where i=1 to n)/an average value of some, which correspond to said some of capacitances Ci, wherein i=1 to n, of capacitances $C_{gj}$, where $j=1$ to n.) essentially and for judging, for $1 \leq j < n$, that a wiring j has a defect if essentially $C_j < \mu C_{gj}(1-\Delta e)$ or $C_j > \mu C_{gj}(1+\Delta e)$ with $\Delta e$ being a positive tolerance rate.

6. An apparatus according to claim 5, further comprising a resistance measuring device for measuring a resistance between two of said probes, wherein said control & judging device, when said wiring j has been judged to be defective, controls said probe drive device and said resistance measuring device so as to measure a conduction resistance of said wiring j and so as to measure an insulation resistance between said wiring j and another wiring, and judges a type of said defect based upon said conduction resistance and said insulation resistance.

7. An apparatus according to claim 6, wherein said control & judging device excludes said capacitances $C_i$ and $C_{gi}$ from objects of calculation of said ratio $\mu$ if essentially $C_i < C_{gj}(1-\Delta e0)$ or $C_i > C_{gj}(1+\Delta e0)$ with $\Delta e0$ being a value larger than said $\Delta e$.

8. An apparatus according to claim 7, wherein said control & judging device selects capacitances, which are used for calculating said ratio $\mu$, having relatively small values among all capacitances $C_1$ to $C_n$ and $C_{g1}$ to $C_{gn}$.

* * * * *